(12) United States Patent
Qawami et al.

(10) Patent No.: US 9,064,560 B2
(45) Date of Patent: *Jun. 23, 2015

(54) INTERFACE FOR STORAGE DEVICE ACCESS OVER MEMORY BUS

(71) Applicant: Intel Corporation, Santa Clara, CA (US)

(72) Inventors: Shekoufeh Qawami, El Dorado Hills, CA (US); Rajesh Sundaram, Folsom, CA (US); David J. Zimmerman, El Dorado Hills, CA (US); Robert W. Faber, Hillsboro, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/075,765

(22) Filed: Nov. 8, 2013

(65) Prior Publication Data

US 2014/0075107 A1    Mar. 13, 2014

Related U.S. Application Data

(63) Continuation of application No. 13/111,839, filed on May 19, 2011, now Pat. No. 8,607,089.

(51) Int. Cl.
*G06F 1/12* (2006.01)
*G06F 13/42* (2006.01)
(Continued)

(52) U.S. Cl.
CPC .............. *G11C 7/222* (2013.01); *G06F 13/42* (2013.01); *H04L 5/00* (2013.01); *H04L 7/00* (2013.01); *G06F 13/1694* (2013.01); *G06F 1/12* (2013.01); *Y02B 60/33* (2013.01)

(58) Field of Classification Search
CPC ....... G06F 1/12; G06F 13/1694; G11C 7/222; H04L 5/00; H04L 7/00

USPC .................. 713/400, 500; 711/100, 105, 187; 710/22, 25, 61

See application file for complete search history.

(56) References Cited

U.S. PATENT DOCUMENTS 5,912,839 A    6/1999   Ovshinsky et al.
6,434,073 B2   8/2002   Guliani et al.
(Continued)

OTHER PUBLICATIONS

"*JEDEC Standard*", JEDEC Solid State Technology Association 2010, Arlington, VA, Feb. 2010, 238 pages.
(Continued)

*Primary Examiner* — Jaweed A Abbaszadeh
*Assistant Examiner* — Terrell Johnson
(74) *Attorney, Agent, or Firm* — Blakely, Sokoloff, Taylor & Zafman LLP

(57) ABSTRACT

A nonvolatile storage or memory device is accessed over a memory bus. The memory bus has an electrical interface typically used for volatile memory devices. A controller coupled to the bus sends synchronous data access commands to the nonvolatile memory device, and reads the response from the device bus based on an expected timing of a reply from the nonvolatile memory device. The controller determines the expected timing based on when the command was sent, and characteristics of the nonvolatile memory device. The controller may not need all the electrical signal lines available on the memory bus, and could issue data access commands to different groups of nonvolatile memory devices over different groups of electrical signal lines. The memory bus may be available and configured for either use with a memory controller and volatile memory devices, or a storage controller and nonvolatile memory devices.

18 Claims, 10 Drawing Sheets

(51) Int. Cl.
*H04L 5/00* (2006.01)
*H04L 7/00* (2006.01)
*G06F 13/16* (2006.01)
*G11C 7/22* (2006.01)

(56) References Cited

U.S. PATENT DOCUMENTS

| | | |
|---|---|---|
| 6,459,645 B2 | 10/2002 | Guliani et al. |
| 6,463,004 B2 | 10/2002 | Guliani et al. |
| 6,920,539 B2 | 7/2005 | Qawami et al. |
| 6,996,749 B1 | 2/2006 | Bains et al. |
| 7,168,026 B2 | 1/2007 | Garney et al. |
| 7,321,997 B2 | 1/2008 | Zimmerman et al. |
| 7,328,304 B2 | 2/2008 | Royer, Jr. et al. |
| 7,345,914 B2 | 3/2008 | Qawami et al. |
| 7,373,452 B2 | 5/2008 | Suh |
| 7,412,627 B2 | 8/2008 | Bains et al. |
| 7,451,263 B2 | 11/2008 | Oh et al. |
| 7,516,267 B2 | 4/2009 | Coulson et al. |
| 7,533,215 B2 | 5/2009 | Faber |
| 7,536,267 B2 | 5/2009 | Zimmerman et al. |
| 7,590,918 B2 | 9/2009 | Parkinson |
| 7,725,645 B2 | 5/2010 | Qawami |
| 7,797,479 B2 | 9/2010 | Trika et al. |
| 7,802,061 B2 | 9/2010 | Qawami et al. |
| 7,984,319 B2 | 7/2011 | Tahara |
| 8,006,044 B2 | 8/2011 | Qawami et al. |
| 8,375,189 B2 | 2/2013 | Qawami et al. |
| 8,423,742 B2 | 4/2013 | Miyamoto |
| 8,458,415 B2 | 6/2013 | Qawami et al. |
| 8,462,537 B2 | 6/2013 | Karpov |
| 8,462,577 B2 | 6/2013 | Zeng |
| 8,595,597 B2 | 11/2013 | Xie et al. |
| 8,612,666 B2 | 12/2013 | Royer, Jr. et al. |
| 8,612,676 B2 | 12/2013 | Dahlen et al. |
| 8,612,809 B2 | 12/2013 | Casper et al. |
| 8,649,212 B2 | 2/2014 | Kau et al. |
| 8,838,935 B2 | 9/2014 | Hinton |
| 2001/0000692 A1 | 5/2001 | Guliani et al. |
| 2001/0001263 A1 | 5/2001 | Guliani et al. |
| 2005/0080581 A1 | 4/2005 | Zimmerman et al. |
| 2005/0114588 A1 | 5/2005 | Lucker et al. |
| 2006/0277359 A1 | 12/2006 | Faber |
| 2007/0094445 A1 | 4/2007 | Trika et al. |
| 2008/0010418 A1 | 1/2008 | Kao |
| 2008/0147940 A1 | 6/2008 | Kao et al. |
| 2008/0270811 A1 | 10/2008 | Chow et al. |
| 2008/0306723 A1* | 12/2008 | De Ambroggi et al. ........ 703/21 |
| 2009/0172213 A1 | 7/2009 | Jayachandran et al. |
| 2010/0291867 A1 | 11/2010 | Abdulla et al. |
| 2010/0293317 A1 | 11/2010 | Confalonieri et al. |
| 2010/0306446 A1 | 12/2010 | Villa et al. |
| 2010/0306453 A1 | 12/2010 | Doller |
| 2010/0318712 A1* | 12/2010 | Boldyrev et al. ............. 710/308 |
| 2010/0318718 A1 | 12/2010 | Eilert et al. |
| 2011/0153916 A1 | 6/2011 | Chinnaswamy et al. |
| 2012/0059970 A1 | 3/2012 | Hinkle et al. |
| 2012/0155160 A1 | 6/2012 | Alam et al. |
| 2012/0159045 A1 | 6/2012 | Hinkle et al. |
| 2012/0159112 A1* | 6/2012 | Tokusho et al. ............... 711/171 |

OTHER PUBLICATIONS

"The Basics of Phase Change Memory (PCM) Technology", *Numonyx*, 2009-2010, 4 pages.

"Phase Change Memory (PCM): A new memory technology to enable new memory usage models", *Numonyx*, 2009, 4 pages.

U.S. Appl. No. 12/890,585, filed Sep. 24, 2010.

Notice of Allowance from U.S. Appl. No. 13/111,839 mailed Aug. 7, 2013, 12 pages.

Abdulla, Mostafa, et al., "*Will Phase Change Memory (PCM) Replace DRAM or NAND Flash?*", Flash Memory Summit, Aug. 19, 2010, 13 pages.

Annunziata, Roberto, et al., "Phase Change Memory Technology for 90nm Embedded Non Volatile Memory Applications", *Technology R&D*, STMicroelectronics, Italy, 2010, 2 pages.

Atwood, Greg, "*The Evolution of Phase Change Memory: Why PCM is Ready For Prime Time as a Next-Generation, Nonvolatile Memory*", Micron Technology Inc., Jul. 26, 2010, 5 pages.

Condit, Jeremy, et al., "*Better I/O Through Byte-Addressable Persistant Memory*", SOSP'09, Oct. 11-14, 2009, Big Sky Montana, USA, 14 pages.

Dipert, Brian, "Numonyx Alverstone Phase-Change-Memory Team", *EDN Special Section*, 2010, Reed Business Information, Mar. 4, 2010, 3 pages.

Kau, Derchang, et al., "*A stackable cross point phase change memory*", IEEE 97-4244-5640-6/09, 2009, 4 pages.

Lee, Benjamin C., et al. "Phase Change Memory Architecture and the Quest for Scalability", *Communications of the ACM*, Jul. 2010, vol. 53/No. 7, 9 pages.

Zhang, Wangyuan, et al., "*Exploring Phase Change Memory and 3D Die-Stacking for Power/Thermal Friendly, Fast and Durable Memory Architectures*" University of Florida, Sep. 12-16, 2009, 12 pages.

Lee et al, "Architecting Phase Change Memory as a Scalable DRAM Alternative", ISCA '09, Jun. 20, 2009, 12 pgs., Austin, Texas, USA.

Condit et al., "Better I/O Through Byte-Addressable, Persistent Memory", SOSP '09, Oct. 11, 2009, pp. 133-146. Big Sky, Montana, USA.

Freitas et al., "Storage-class memory: The next storage system technology", IBM J. Res. & Dev., Jul./Sep. 2008, pp. 439-447, vol. 52, No. 4/5.

Caulfield et al., "Moneta: A High-performance Storage Array Architecture for Next-generation, Non-volatile Memories", MICRO 43: Proceedings of the 43rd Annual IEEE/ACM International Symposium on Microarchitecture, Atlanta, GA Dec. 2010 pp. 385-395.

Quereshi et al., "Scalable High Performance Main Memory System Using Phase-Change Memory Technology", ISCA '09, Jun. 20, 2009, 10 pgs., Austin, Texas, USA.

"Compressed NVRAM based Memory Systems", 9 pgs.

Bailey et al., "Operating System Implications of Fast, Cheap, Non-Volatile Memory" 13th USENIX, HOTOS11 2011, May 9-11, 2011, 5 pgs.

Raoux et al., "Phase-change random access memory: A scalable technology", IBM J. Res. & Dev., Jul./ Sep. 2008, pp. 465-479, vol. 52, No. 4/5.

Chen et al., "Rethinking Database Algorithms for Phase Change Memory", 5th Biennial Conference on Innovative Data Systems Research (CIDR '11), Jan. 9, 2011, 11 pgs., Asilomar, California, USA.

Jacob et al., "The Memory System You Can't Avoid It, You Can't Ignore It, You Can't Fake It", 2009, 77 pgs., Morgan & Claypool.

Mogul et al., "Operating System Support for NVM+DRAM Hybrid Main Memory", 12th Workshop on Hot Topics in Operating Systems (HatOS XII), May 18, 2009, 9 pgs.

\* cited by examiner

INTERFACE FOR STORAGE DEVICE ACCESS OVER MEMORY BUS

This application is a Continuation of and claims priority to U.S. patent application Ser. No. 13/111,839 filed May 19, 2011.

FIELD

Embodiments of the invention are generally related to memory or storage device access, and more particularly to accessing nonvolatile storage over a volatile memory bus.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2011, Intel Corporation, All Rights Reserved.

BACKGROUND

A number of different technologies have been developed to store information in computing devices. Generally, the technologies can be classified as either volatile or nonvolatile. Volatile memory loses its state when power is interrupted to the device, whereas nonvolatile storage maintains its state even if power is interrupted. Access to nonvolatile storage has traditionally been much slower than access to volatile memory. The interfacing technologies also vary significantly, and are generally incompatible. Development of new storage and memory technologies has generally been accompanied by new interface hardware and protocols. Thus, each different technology has traditionally required a redesign of the physical interface mechanisms of a computing device.

As mentioned above, access to nonvolatile storage traditionally has been considered very slow relative to access to volatile memory. Thus, read and write commands take longer to implement in traditional nonvolatile storage than in volatile memory. The assumptions about speed and access to nonvolatile storage has been integrated into the design of computing devices, where read and write commands are send to storage, and the processor waits a relatively "long" time for the response as compared to access to volatile memory. Additionally, technology such as direct memory access (DMA) is based on the assumptions of the speed of storage access.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
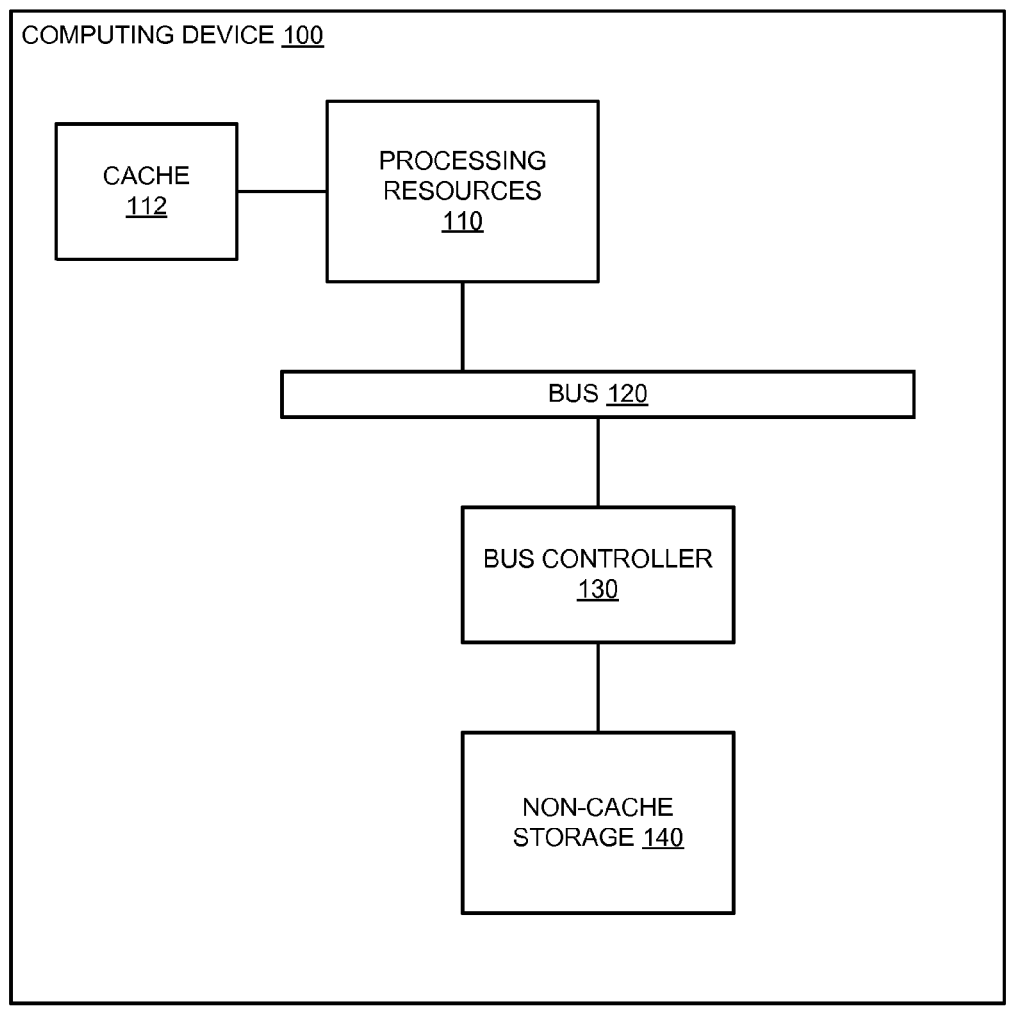
FIG. 1 is a block diagram of an embodiment of a computing device that accesses nonvolatile storage over a memory bus.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

As provided herein, access to a nonvolatile storage device or nonvolatile memory device is provided over a memory bus. The nonvolatile device has access speeds more comparable to traditional volatile memory, and the memory bus is repurposed for access to the nonvolatile device without changing the electrical interface. Thus, the physical interface of a memory bus can be used with a nonvolatile device simply by using a different protocol on the bus. The "protocol" here refers to the use of the electrical interface (the signal lines or wires), or what signal lines are used when, to carry or indicate what signal(s), and how are the various electrical lines to be interpreted. Access to the nonvolatile memory device over the memory bus utilizes the electrical interface of the memory bus, but a different protocol than what is used for volatile memory.

The memory bus has an electrical interface typically used for volatile memory device access. Rather than use of asynchronous polling as typically used with nonvolatile storage, a controller coupled to the bus sends synchronous data access commands to the nonvolatile storage device. The characteristics of the nonvolatile memory device and the bus are known, which allows the responses to be deterministic. Thus, the controller reads responses from the device bus based on an expected timing of a reply from the nonvolatile device. The controller determines the expected timing based on when the access command was sent, and the characteristics of the nonvolatile device.

It will be understood that the physical interface pins tend to add significant packaging cost relative to the overall cost of a chip used in a computing system. The use of more pins is common for volatile memory, which typically only has up to a few gigabytes of memory in a computer, and less for portable devices. However, the amount of storage in a computing device is typically at least a couple of orders of magnitude greater than the amount of memory, in which case the costs of using the physical interface lines adds up quickly. Thus, in one embodiment, a nonvolatile device connected to the memory bus does not use all the electrical signal lines available on the memory bus. The controller can multiplex the commands over fewer channels but using multiple clock cycles. The controller could also issue data access commands to different groups of devices for storage over different groups of electrical signal lines.

It will be understood that "memory" and "storage" are frequently used interchangeably. For purposes of description herein, "volatile memory" is used to refer to volatile resources that lose state if power is interrupted to the device, and "nonvolatile memory" and "storage" are used to refer to nonvolatile resources that retain state even in the event power is interrupted to the device. Reference herein to nonvolatile memory could also be stated as nonvolatile storage. It will be understood that retaining state refers to retaining information recorded in the device. While the data recorded in volatile memory may be present after a power interruption occurs, there is no expectation that the data recorded can be retrieved as there is with nonvolatile storage.

The interface provided herein allows access to a nonvolatile device over a "fast" interface such as a memory bus for nonvolatile devices that have access capabilities relatively comparable to volatile memory devices that would use the bus. In contrast to traditional systems, a storage device that is fast enough for memory bus bandwidth and latency is connected to a memory bus architecture.

FIG. 1 is a block diagram of an embodiment of a computing device that accesses nonvolatile storage over a memory bus. Computing device 100 represents any of a broad range of electronic devices that may traditionally use any of a number of variants of dynamic random access memory (DRAM) and storage, or use Flash memory, or a combination of these. Such devices may include server devices, laptops, desktops, handheld devices including tablets and mobile phones, smartphones, and other portable electronics.

Device 100 includes processing resources 110, which represent microcontrollers, microprocessors, central processing units (CPUs), programmable logic controllers, or other processing units. Processing resources 110 may include a single device or multiple devices, including multi-core devices. Processing resources 110 execute instructions and control the flow of operation for device 100.

It is common for certain processing resources 110 (such as CPUs) to have on-chip and/or off-chip cache 112 to temporarily store instructions and data for current operations or recently executed operations. Thus, in one embodiment, device 100 includes cache 112. Cache 112 generally has very low latency for access, and close physical proximity to processing resources 110.

Device 100 includes bus 120, which represents the multiple signal lines that make up the electrical interface over which data and control signals are exchanged between devices connected via the bus. More particularly, bus 120 is a bus with an electrical interface compatible with a type of volatile memory. For example, bus 120 may have an electrical interface compatible with dual data rate (DDR) version 3 (DDR3) or version 4 (DDR4). Alternatively, bus 120 may have an electrical interface compatible with low-power dual data rate (LP-DDR). Different implementations will be understood for any of a variety of DDR standards (e.g., DDR, DDR2, DDR3, DDR4), or LP-DDR standards (e.g., LP-DDR, LP-DDR2, LP-DDR3 (proposed)). The electrical interfaces of these memory protocols are well defined by standard. For example, DDR: JESD79F, February 2008; DDR2: JESD79-2F, November 2009; DDR3: JESD79-3-1, July 2010; LPDDR: JESD209B, February 2010; LPDDR2: JESD209-2D, December 2010; or earlier or later versions of the standards. Standards are currently in development for DDR4 and LP-DDR3, but are not completed standards as of the filing of this document. The same principles would apply with other memory protocols or memory types, including proprietary memory systems.

It will be understood that traditional memory access speeds are on the order of tens of nanoseconds, whereas traditional storage access speeds are on the order of milliseconds. Devices connected to the electrical interface of bus 120 (an electrical hardware bus interface) should have access times on the order of tens of nanoseconds.

Device 100 includes non-cache storage or nonvolatile memory device 140. Nonvolatile memory device 140 represents a type of storage device that has an access latency compatible with a type of memory device typically used with bus 120. Thus, nonvolatile memory device 140 may be understood as having an access latency on the order of tens of nanoseconds. In one embodiment, nonvolatile memory device 140 is a device that is or includes phase change memory (e.g., PCM, PCMS (phase change memory and switch), or MLC PCM (multi-level cell PCM)).

Phase change memory (PCM) stores data through the change of a state of a storage area (e.g., between poly-crystalline and amorphous). PCMS includes multi-layered or stacked PCM cell arrays with a switch, such as a cross point array of PCM cell layered with an ovonic threshold switch (OTS). Thus, PCMS can stack, or place, multiple layers of PCM arrays within a single die. The stacked PCM may also be referred to as vertically integrated memory cell. The ability to layer or stack arrays of PCMs provides the scalability to higher memory densities while maintaining the performance characteristics of PCM.

As used herein, "PCMS" will be used to generically identify phase change memory products, and descriptions of methods, systems, and techniques used on PCMS can be understood to apply also to PCM or MLC PCM, for example. Current-technology DDR memory access times are on the order of 30 ns, and PCMS access times are on the order of 50-80 ns for reads, and slightly slower for writes. Thus, it may be said that nonvolatile memory device 140 is a nonvolatile storage device that has latency characteristics compatible with the electrical interface of bus 120.

Device 100 includes bus controller 130, which includes processing logic to read data from and write commands over bus 120. More particularly, bus controller 130 "speaks" the same protocol as nonvolatile memory device 140. Bus 120 may be a bus with multiple agents or a direction connection (point to point electrical interface) between processing resources and nonvolatile memory device 140 (or bus controller 130). Read and write commands to nonvolatile memory device 140 over bus 120 are routed through bus controller 130. The commands are synchronous. Bus controller 130 can determine an expected timing of a response from nonvolatile memory device 140 based on when the controller issued the command, as well as based on characteristics of nonvolatile memory device 140. The characteristics include parameters that indicate typical response (latency) times for the device. Bus controller 130 can then read the response from nonvolatile memory device 140 based on the expected timing, without the need for polling the storage device as is currently done when access nonvolatile storage.

While reference has been made specifically to the example system of FIG. 1, it will be understood in general that a system is described to connect a nonvolatile storage device or nonvolatile memory device to a memory bus and access the nonvolatile storage device directly via the electrical interface of the memory bus with a different protocol than typically used with the memory bus.

As mentioned above, the nonvolatile memory device has latency times compatible with the electrical interface of the memory bus. The same physical (PHY) layer can be used for either volatile memory (e.g., DRAM) or nonvolatile memory device (e.g., PCMS). The use of the same physical layer allows for simpler design management of systems that could use either volatile memory or nonvolatile storage. The fast nonvolatile storage can replace some or all volatile memory in computing, mobile, or wireless platforms.

In one embodiment, the nonvolatile memory device on the memory bus can be used efficiently as storage or memory. In one embodiment, the nonvolatile memory device uses a subset of the signal lines of the hardware interface of the memory bus used by volatile memory that would use the memory bus. The number of signal lines can be reduced for access to the nonvolatile memory device by extending the command unit interval (UI) over multiple clock cycles.

Traditional nonvolatile storage and volatile memory have differences in how they are accessed. Nonvolatile storage typically uses polling to access the memory locations. Volatile memory generally uses a buffer for read and write, rather than working directly on the memory locations. Newer advances in technology, such as with Phase Change Memory (PCM or PCMS), seeks to provide storage that has access speeds more comparable to volatile memory. The advantage to PCMS is that it might be able to replace both the nonvolatile storage as well as some volatile memory (e.g., a variant of DRAM (dynamic random access memory)). The use of PCMS would change many of the assumptions underlying the use of memory and/or storage, such as the speed and access mechanism assumptions.

PCMS has the ability to provide several changes in computer system architecture. For example, one or more banks of PCMS devices could be used as a hard drive instead of rotating platter technology, or solid state drive (SSD) instead of using NAND technology for nonvolatile storage. In mobile devices, such as smartphones or tablet devices, a PCMS device could be placed on existing memory buses, changing only the memory controller to a controller as described herein. As described herein, a controller such as that used in the example of the smartphone or tablet is that a controller could configured (e.g., programmed) to provide either or both of memory and storage access functions. Thus, in one embodiment, PCMS could be used in existing mobile platforms by changing controller logic and enabling integration of the PCMS device onto the platform in place of RAM.

Thus, PCMS can provide the advantage of having a nonvolatile storage where previously volatile memory was used. Much larger amounts of memory could be used in systems, which can serve as both memory and storage for the system. The latency of nonvolatile storage access is dramatically reduced to be comparable with that of traditional volatile memory (e.g., ~10 ms to tens of nanoseconds for PCMS). Additionally, the power use associated with nonvolatile storage access would be significantly reduced, without having to refresh the memory as is currently done with volatile memory. Both factors would contribute to power savings in a device implementing PCMS.

In one implementation, PCMS is used on a memory bus compliant with DDR4. In that implementation, certain signal lines can be redefined, such as using a DDR4 Alert signal as a PCMS write failure signal, and using a status register to log write failure on PCMS. Whereas DDR4 uses approximately 20 signal lines, the subset of signal lines needed by PCMS may be approximately 12 of the available signal lines. In one embodiment, command registers for PCMS include parameters to provide flexibility to use PCMS as memory or storage with different burst length, read/write latency delay, and length of command UI. Other parameters may also be modifiable.

As mentioned above, traditionally the volatile memory of a system and the nonvolatile storage do not share access buses. Rather, they are separate systems within a computing device. As provided herein, nonvolatile storage is connected to the volatile memory bus, allowing access to the storage device as either memory or storage. The nonvolatile storage device can be considered to share the memory bus with volatile memory in that either device could be connected to the same bus. The sharing of the physical bus architecture allows repurposing the bus without having to engineer a new bus for the fast nonvolatile storage device.

The sharing of the physical architecture can be accomplished by applying different protocols for the connected device type. The protocol for volatile memory is typically based on a "RAS/CAS" (row address select or strobe/column address select or strobe) mechanism. In one embodiment, the protocol for the nonvolatile memory connected to a memory bus is a command-based or packet-based protocol. The RAS/CAS mechanism involves selecting a row and a column, which places data into a buffer that is then read. The command-based protocol addresses a memory location, and access is directly to the specified location.

The use of different protocols can be described as putting different logical layers on top of the electrical interface, or on top of the hardware architecture. Different logical controllers will control the different protocols. The application of different controllers can be performed in a variety of different ways. In one embodiment, different hardware logic (controller) is used for volatile memory versus nonvolatile storage. There may be a single location where one device or the other can be coupled to the bus, or two different locations for the different hardware devices. In one embodiment, the same hardware controller has logic (e.g., firmware or programmed hardware logic) to implement either a memory controller or a storage controller.

In one embodiment, there is no requirement for an activate cycle. Rather the nonvolatile memory device on the memory bus is accessed directly instead of through a buffer. The nonvolatile memory device that has the requested address or storage location simply puts the data onto the memory bus, and the controller can read it off the bus based on deterministic timing.

The following tables (Table 1 and Table 2) illustrate one example embodiment of signal line allocation and protocol commands, respectively.

may send data access commands with fewer signal lines than available on memory bus 210.

Nonvolatile memory 240 includes electrical interface 242, which represents hardware resources to enable nonvolatile memory 240 to connect to memory bus 210. Among the electrical interface hardware of nonvolatile memory 240 is a

TABLE 1

Example pinout for memory bus connection

| | MEMORY | | | STORAGE | | |
|---|---|---|---|---|---|---|
| PIN NAME | X8 | X16 | X32 | X8 | TYPE | DESCRIPTION |
| CLK, CLK# | | 2 | | 2 | I | Clock: Differential clock inputs |
| Reset# | | 1 | | 1 | I | Reset (asserted low): Asynchronous reset |
| CA: muxed | | 10 | | 5 | I | Command Address Bus. Address multiplexed with command. Command UI: Memory - 4 cycles; Storage - 8 cycles |
| DQ | 8 | 16 | 32 | 8 | IO | Data: Bidirectional data bus |
| DQS, DQS# | 2 | 4 | 8 | 2 | IO | Differential Data Strobe: Differential pair for each byte of data |
| CS# | | 1 | | 1 | I | Chip Select |
| CKE | | 1 | | 1 | I | Clock Enable: CKE high activates, CKE low deactivates internal clock signals and device input buffers and output drivers |
| ODT | | 1 | | 1 | I | On Die Termination: Enables internal termination on DQ, DQS, and DQS# drivers. Configurable through Mode Register |
| Alert (Error) | | 1 | | 1 | O | Error (asserted low): Indicates error during write operation |
| VDD | 8 | 8 | 9 | 8 | PWR | Power Supply for core |
| VSS | 8 | 8 | 10 | 8 | PWR | Ground for core |
| VDDQ | 5 | 5 | 9 | 5 | PWR | Power supply for DQ, DQS, DQS# |
| VSSQ | 4 | 4 | 8 | 4 | PWR | Ground for DQ, DQS, DQS# |
| ZQ | | 1 | | 0 | IO | Impedance Reference for calibration |
| VrefCA | | 1 | | 0 | PWR | Reference Voltage for CA input buffers |
| VPP(+/−) | | 2 | | 2 | PWR | Read/Write Bias Voltage |
| Total | 56 | 66 | 97 | 49 | | |

TABLE 2

Example command set for nonvolatile storage on memory bus

| COMMAND | OP CODE | DESCRIPTION |
|---|---|---|
| Read | 00001 | Read command, length based on read burst length |
| Write | 00010 | Write command based on write burst length |
| Mode Register/ Status Read | | Read device parameter values stored in Mode Register Read Reg 0: Status register |
| | 00011 | Read Reg 1: Mode Register 0 Read Reg 2: Mode Register 1 [and so forth] |
| Mode Register Set | 00100 | Write device parameter values to Mode Register |
| ZQ Cal | 00101 | DQ output driver and ODT calibration |
| Power Down Entry | 00110 | Put device in low power mode |
| Power Down Exit | CKE/CS# | Exit from low power mode |
| Read ID | 00111 | Read Configuration Table |
| Set Plane | 01000 | Turns on plane for particular slice and partition location to reduce read latency across plane at cost of higher power |
| Abort | 01001 | Abort write |
| Preset Write | 01010 | Program entire write BL with "1" (preset) |
| Reset Write | 01011 | Write reset "0" bits only |
| Assign Device ID | 01100 | Assign Device ID if storage devices share single CS |
| Select Device ID | 01101 | Select specific Device ID to send commands for shared CS topology |
| Refresh | 01111 | Refresh a block |

Figure 2:
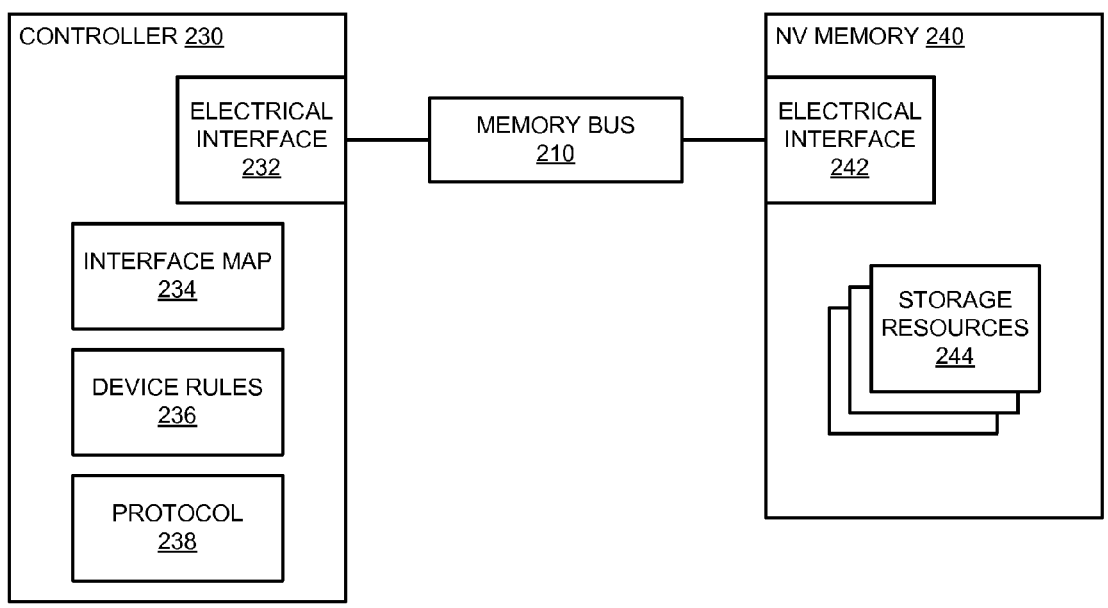
FIG. 2 is a block diagram of an embodiment of a system with a controller that access nonvolatile storage over a memory bus.

FIG. 2 is a block diagram of an embodiment of a system with a controller that access nonvolatile memory over a memory bus. System 200 represents any type of computing device that uses nonvolatile (nv) memory 240 on memory bus 210. Memory bus 210 is a bus with an electrical interface that is compatible with a volatile memory (e.g., DRAM) standard.

Memory bus 210 includes a certain number of command lines and/or signal lines to implement the volatile memory standard. In one embodiment, nonvolatile memory or nonvolatile storage 240 does not need all the signal lines to receive and respond to access requests. Thus, controller 230 memory location selector specific to an implementation of the nonvolatile memory device. For example, in an implementation using PCM, different PCM products (e.g., PCM or PCMS) use different selectors for accessing memory cells or locations. While the storage arrays are generally the same across different PCM products, the selectors may be implemented differently. However, the use of different selector technology will not generally affect implementation of an access protocol as described herein.

Nonvolatile memory 240 includes storage resources 244. Resources 244 represent the different storage devices of nonvolatile memory 240. The storage devices may be, for example, physically separate I/Cs (integrated circuits) or I/Cs with different storage regions. In one embodiment, storage resources 244 include stacked devices. A lower pin count by using fewer signal lines of memory bus 210 can allow stacking more devices together.

Unlike, for example, DDR-based memory that allows use of only a few banks of memory, nonvolatile memory 240 may have many devices. Thus, commands can be issued to multiple devices on the same bus. Nonvolatile memory 240 is synchronous, which allows controller 230 to know when to expect data to come back in response to a command. Use of the deterministic nature of storage resources 244 allows controller 230 to determine what responses come from which storage resources. In one embodiment, storage resources 244 include some devices that use certain signal lines of electrical interface 242, which other devices may use certain different signal lines. It will be understood that certain lines of electrical interface 242 may overlap even if devices use different lines to receive and respond to commands.

Controller 230 represents logic to control the sending of commands to nonvolatile memory 240 over memory bus 210. Controller 230 includes electrical interface 232 to connect to memory bus 210. In one embodiment, controller 230 includes interface map 234, device rules 236, and protocol 238. From one perspective, these could each be considered to be integrated into the control logic of controller 230. From one perspective, each of these could be considered part of the same thing.

Interface map 234 indicates what pins or lines of electrical interface 232 correspond to what function or operation of interconnecting to memory bus 210 for access to nonvolatile memory 240. Device rules 236 provide the ability for controller 230 to determine timing related to data access commands. More particularly, device rules 236 may indicate types and expected durations of latencies related to a specific device of nonvolatile memory 240. Device rules 236 allow controller 230 to recognize data received from nonvolatile memory 240 in response to a command. Device rules 236 may include indications of characteristics of the operation of storage resources 244.

Protocol 238 represents mechanisms for "speaking" the interface protocol to access nonvolatile memory 240 over memory bus 210. In one embodiment, protocol 238 includes logic to allow controller 230 to create and maintain a protocol stack to perform data access from nonvolatile memory 240. Protocol 238 represents the timing and the executing of operations related to determining the device expected delays. In one embodiment, protocol 238 allows sharing of memory and storage pages.

Figure 3:
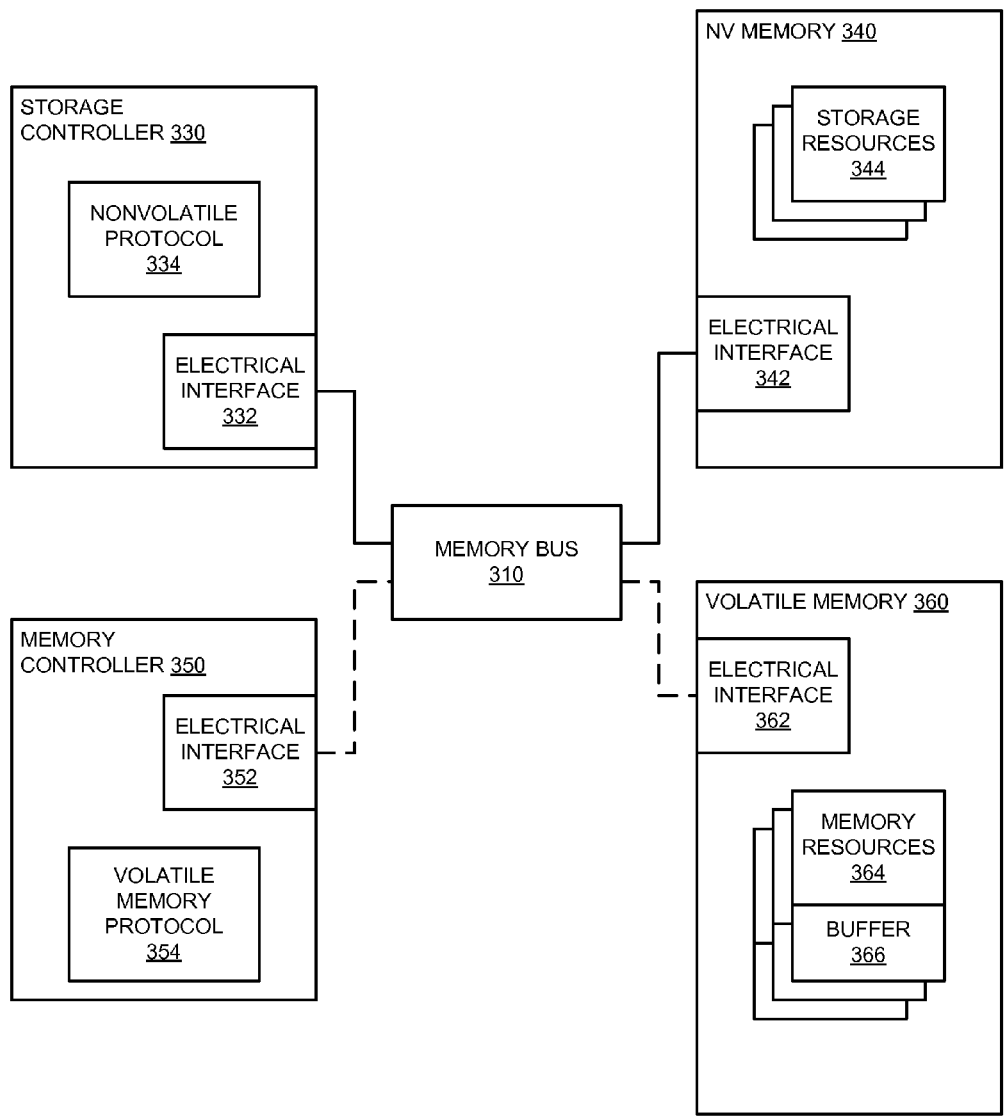
FIG. 3 is a block diagram of an embodiment of a system having a memory bus that can support either nonvolatile storage or traditional volatile memory.

FIG. 3 is a block diagram of an embodiment of a system having a memory bus that can support either nonvolatile memory or traditional volatile memory. System 300 represents a computing device that can use nonvolatile (nv) memory 340 on memory bus 310 according to any embodiment described herein. Memory bus 310 is a bus with an electrical interface that is compatible with a volatile memory standard.

In one embodiment, system 300 includes connections for either nonvolatile memory or nonvolatile storage 340 and storage controller 330, or for volatile memory 360 and memory controller 350 connected to memory bus 310. Thus, system 300 could be built out with either nonvolatile storage on the memory bus, or with volatile memory on the memory bus. In one embodiment, nonvolatile memory 340 and memory 360 will not be connected to memory bus 310 at the same time, illustrated by the solid and dashed lines, indicating that they may be separately connectable. Memory bus 310 is designed for low latency and high bandwidth, which can support expected operation with memory 360, or can support low latency and high bandwidth operation from nonvolatile memory 340.

Nonvolatile memory 340 includes electrical interface 342, which represents hardware resources to enable nonvolatile memory 340 to connect to memory bus 310. Nonvolatile memory 340 includes storage resources 344, which represent the different storage devices of nonvolatile memory 340, and may include stacked devices. Nonvolatile memory 340 may have many storage devices, and access commands can be issued to multiple devices on the same bus. Nonvolatile memory 340 is synchronous, which allows controller 330 to know when to expect data to come back in response to a command.

Storage controller 330 represents logic to control the sending of commands to nonvolatile memory 340 over memory bus 310. Storage controller 330 includes electrical interface 332 to connect to memory bus 310. Storage controller 330 also includes mechanisms to enable it to communicate with a nonvolatile storage protocol 334 as described herein to access nonvolatile memory 340. Protocol 334 may include mapping information, rules regarding timing of responses for nonvolatile memory 340, protocol stack management logic, or other logic for implementing a protocol to access nonvolatile memory 340.

Memory 360 includes electrical interface 362, which represents hardware resource to enable memory 360 to connect to memory bus 310. It will be understood that whereas electrical interface 342 can use fewer than all of the signal lines of memory bus 310, electrical interface 362 of memory 360 is designed for all of the signal lines of memory bus 310. Similarly, electrical interface 352 of memory controller 350 is designed for all of the signal lines of memory bus 310.

Memory 360 includes memory resources 364, which represent the resources on which data is recorded in system 300. Memory 360 is volatile, and typically synchronous. Memory resources 364 are generally accessed through sense amplifiers, identified as buffers 366. It will be understood that the sense amplifiers are typically an integral part of the memory resources, and are not separate I/Cs. With buffers 366, access to memory resources 364 requires an additional activation operation. In contrast, in one embodiment, storage resources 344 of storage 340 do not require access via buffers, and so no activation operations are required. While memory controller 350 issues activation commands in conjunction with a memory access, storage controller 330 can issue a storage access command without an accompanying activation command.

Buffers 366 may be used to re-drive bus signals, which enables increasing the number of memory resources 364 (or more particularly, the number of memory devices) on memory bus 310 while minimizing bus electrical loading. While not shown in FIG. 3, in one embodiment, similar buffers could be used between storage resources 344 and electrical interface 342.

Memory controller 350 represents logic to control the sending of commands to memory 360 over memory bus 310. Memory controller 350 includes electrical interface 352 to connect to memory bus 310. Memory controller 350 also includes mechanisms to enable it to communicate with a volatile memory protocol 354. Protocol 354 may include mapping information, protocol stack management logic, or other logic for implementing a protocol to access memory 360.

It will be understood that even though storage controller 330 and memory controller 350 are represented as different entities in system 300, they could be implemented as two separate physical devices or two logical portions of a single physical device. Thus, storage controller 330 and memory controller 350 are separate controllers, which may mean they are separate physical devices that could be used in system 300. For example, a manufacturer of system 300 may choose between putting a device on a printed circuit board (PCB) for either storage controller 330 or memory controller 350, depending on the implementation. Other physical elements related to memory bus 310 would be manufactured the same in either case.

Alternatively, storage controller 330 and memory controller 350 may be implemented by the same hardware device (e.g., a microcontroller I/C) that has different firmware. The device could be loaded with either or both of storage controller firmware or memory controller firmware. Storage controller firmware allows the device to implement control over memory bus 310 to interface with storage 340, while memory controller firmware enables the device to implement control over memory bus 310 to interface with memory 360. Alternatively, storage controller 330 and memory controller 350 may be implemented by the same hardware device without firmware, or without separate firmware.

Figure 4:
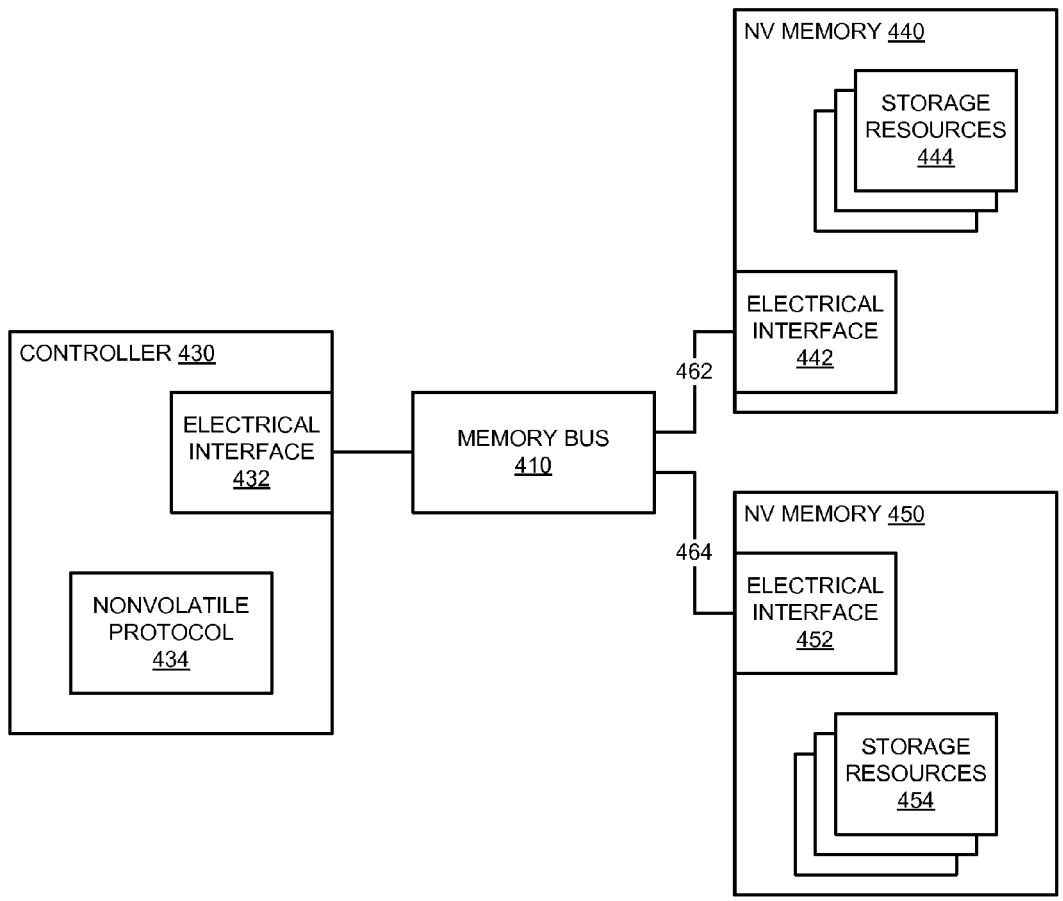
FIG. 4 is a block diagram of an embodiment of a system having a memory bus that supports nonvolatile storage on different channels.

FIG. 4 is a block diagram of an embodiment of a system having a memory bus that supports nonvolatile memory on different channels. System 400 represents a computing device that can use nonvolatile (nv) memory on memory bus 410 according to any embodiment described herein. Memory bus 410 is a bus with an electrical interface that is compatible with a volatile memory standard.

Controller 430 represents logic to control the sending of commands to storage over memory bus 410. Controller 430 includes electrical interface 432 to connect to memory bus 410. Controller 430 also includes mechanisms to enable it to communicate with a nonvolatile storage protocol 434 as described herein to access nonvolatile memory or nonvolatile storage 440. Protocol 434 may include mapping information, rules regarding timing of responses for the storage in system 400, protocol stack management logic, or other logic for implementing a protocol to access storage over memory bus 410.

In one embodiment, system 400 includes storage resources separated into different groups. Nonvolatile memory 440 includes electrical interface 442 and storage resources 444. Nonvolatile memory 450 includes electrical interface 452 and storage resources 454. The electrical interfaces represent hardware resources to enable nonvolatile memory 440 and 450 to connect to memory bus 410. Electrical interface 442 uses at least some different signal lines than those used by electrical interface 452.

In one embodiment, the connection of nonvolatile memory 440 could be considered over a different channel or logical interface, illustrated by 462, than that of nonvolatile memory 450, illustrated by 464. If nonvolatile memory is implemented in system 400 in such a way that some signal lines available on memory bus 410 are not used by the nonvolatile storage, there may be enough signal lines for controller 430 to implement different storage channels by simply using different groups of signal lines for different groups of nonvolatile memory devices. Thus, storage resources 444 are grouped on interface 462, which storage resources 454 are grouped on interface 464.

Figure 5:
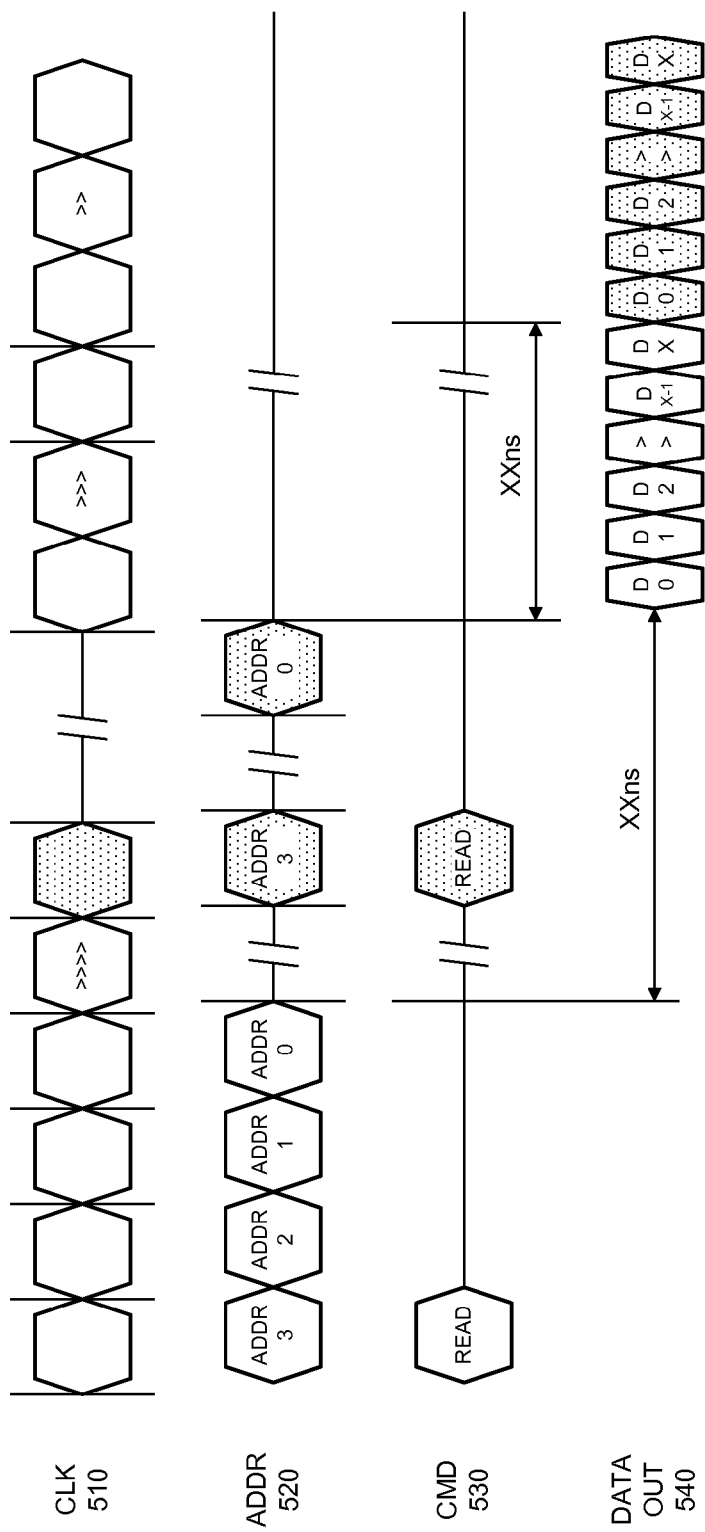
FIG. 5 is a timing diagram of an embodiment of a read command in a system with access to a nonvolatile memory device over a memory bus.

FIG. 5 is a timing diagram of an embodiment of a read command in a system with access to a nonvolatile memory device over a memory bus. As mentioned above, the use of more signal lines corresponds with increased cost in the electrical interfaces. One way to reduce the use of signal lines is to multiplex the signal lines and use multiple UIs per command. In one embodiment, data access commands are implemented with 4, 6, or 8 UIs. For example, a 10 wire or signal line interface sent over 4 UIs allows about 40 bits per command, instead of restricting the protocol to 10-bit commands, which would not likely be sufficient to access nonvolatile storage in most modern systems. Thus, in one embodiment, commands are sent over multiple clock cycles.

Clock (CLK) 510 represents a clock signal, with each block indicating a clock cycle. Address (ADDR) 520 represents an address signal, which is shown sent over multiple UIs. Two different read commands are illustrated to two different nonvolatile memory devices. The first read command is shown first on command signal line 530, and the second is shown after it. The second read command is shaded. In data out line 540, data signals are shown non-shaded in response to the first read command, and shaded in response to the second read command, respectively.

There are several time breaks in the figure, which means that not every detail is shown. Thus, for example, address line 520 shows four UIs of address for the first read command (address 3:0) and only two of the four UIs for the second command, with a break between them. In one embodiment, more or fewer than four UIs are used per command. It will also be understood that slight offsets on the timing are illustrated, which correspond more to expected practical performance than idealized performance. Thus, signals on address line 520 and command line 530 are slightly offset (delayed) from the clock, and the data output is slightly offset from the commands. The amount of offset or delay is not meant to be representative or expected, and is thus not limiting.

As is seen from the illustration, some delay XX ns after the address of the target nonvolatile memory device is received at the nonvolatile memory device, the nonvolatile memory device sends data D0 through DX. In the example, 'XX' is understood as some amount of time, and 'X' is an integer number of bits that the nonvolatile memory device sends in response to the read request. Another delay XX ns after the second address is received, the second device sends data. The data signals can be distinguished as being from the two different nonvolatile memory devices by the determinism of their characteristic delays and/or other characteristic parameters of the nonvolatile memory devices.

Thus, based on knowing when the first read command was sent, knowing how long the address takes to send, and knowing the characteristic delay of XX ns, the controller can identify the first data elements as being sent in response the first read command, and the second data elements as being sent in response to the second read command. The expected timing can be precalculated and stored as a constant, or computed each time to allow the controller to determine when a response is received to a read command.

Figure 6:
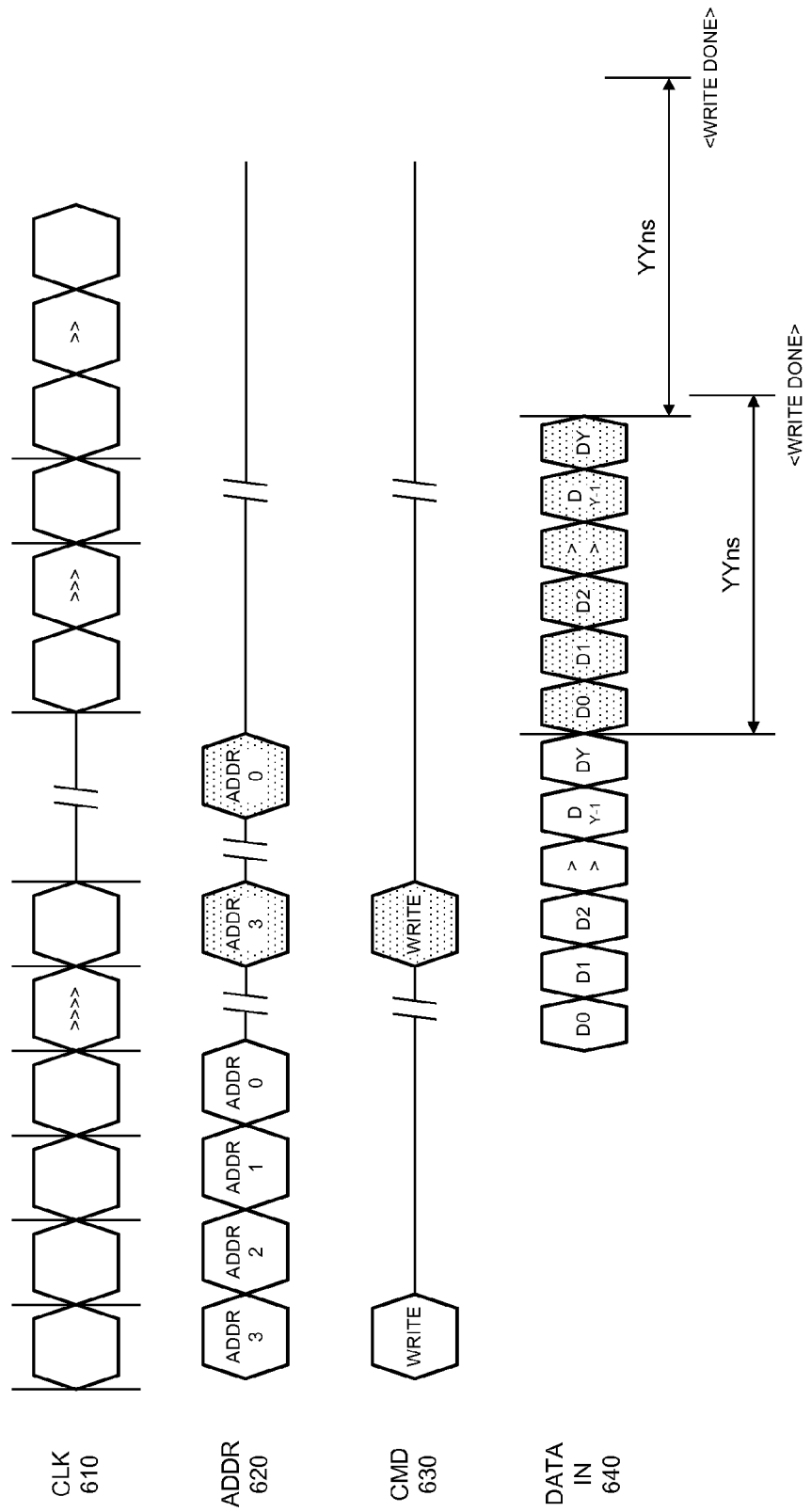
FIG. 6 is a timing diagram of an embodiment of a write command in a system with access to a nonvolatile memory device over a memory bus.

FIG. 6 is a timing diagram of an embodiment of a write command in a system with access to a nonvolatile memory device over a memory bus. Similar to the read example of FIG. 5, multiple UIs can be used per write command as shown in the example. Clock (CLK) 610 represents a clock signal, with each block indicating a clock cycle. Address (ADDR) 620 represents an address signal, which is shown sent over multiple UIs. As with the read example, the concatenation of the series of address UIs identifies the address to which the command is to be applied.

Two different write commands are illustrated to two different nonvolatile memory devices. The first write command is shown first on command signal line 630, and the second is shown after it. The second write command is shaded. In data in line 640, data signals are shown non-shaded corresponding to the first write command, and shaded corresponding to the second write command, respectively.

There are several time breaks in the figure, which means that not every detail is shown. Thus, for example, address line 620 shows four UIs of address for the first write command (address 3:0) and only two of the four UIs for the second command, with a break between them. In one embodiment, more or fewer than four UIs are used per command. It will also be understood that slight offsets on the timing are illustrated, which correspond more to expected practical performance than idealized performance. Thus, signals on address line 620 and command line 630 may be slightly offset (delayed) from the clock, and the data output may be slightly offset from the commands. The amount of offset or delay is not meant to be representative or expected, and is thus not limiting.

As is seen from the illustration, data on data in line 640 is received by a specific nonvolatile memory device, and the Y bits of data are written in YY ns, where 'Y' is an integer representing the number of bits of data, and 'YY' is an amount of time it takes the device to write the data. The YY ns is a characteristic time of the nonvolatile memory device, which allows the controller to determine when the device is again available for further access. Similar to the read example above, the write operations are deterministic. While the amount of time YY ns is illustrated as being approximately the same amount of time as it takes for the Y bits of data to be sent over data in 640, the time can be more or less depending on the implementation, and is characteristic of the device.

Figure 7:
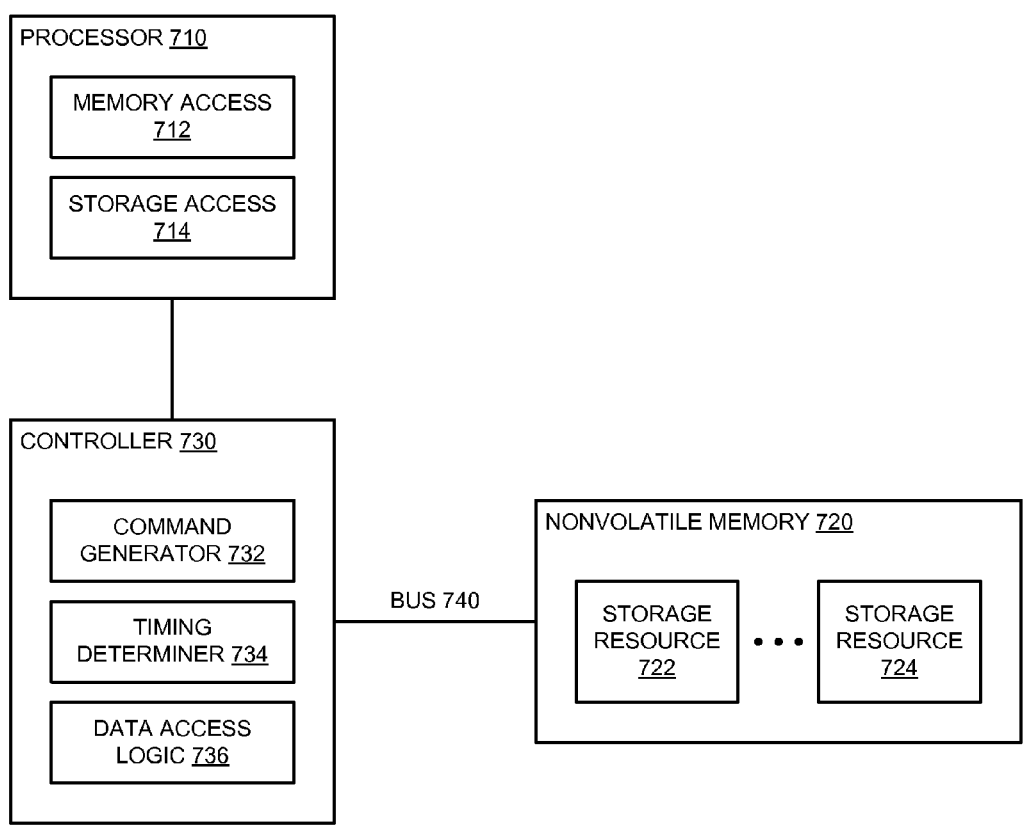
FIG. 7 is a block diagram of an embodiment of a system with a processor that accesses nonvolatile memory over a memory bus.

FIG. 7 is a block diagram of an embodiment of a system with a processor that accesses nonvolatile memory over a memory bus. System 700 represents any of a number of computing devices that may include a nonvolatile memory device on a memory bus. Such computing devices may include servers, desktops, laptops, mobile devices, smartphones, gaming devices, and others. System 700 includes nonvolatile memory 720, which is a nonvolatile memory or nonvolatile storage device according to any embodiment described herein and includes storage resources 722-724. Nonvolatile memory 720 has speeds compatible with the electrical interface of memory bus 740, but is nonvolatile as opposed to the volatile memory the bus is designed to work with.

Controller 730 includes standard logic (hardware and/or software) to control access to nonvolatile memory 720 as is understood in the art. Controller 730 is associated with nonvolatile memory 720 because it controls access to nonvolatile memory 720. In one embodiment, controller 730 includes functionality (e.g., features implemented by logic of controller 730) command generator 732, timing determiner 734, and data access logic 736. The illustrated functionality is not intended to represent all functionality of controller 730. Controller 730 could be implemented with more or fewer functional components than shown.

Command generator 732 enables controller 730 to issue access (e.g., read or write) commands to storage over memory bus 740. The commands may be extended to occur over multiple clock or command cycles. Timing determiner 734 enables controller 730 to access rules and/or stored values for controller 730 to determine expected timing with respect to nonvolatile storage devices connected to memory bus 740 (such as nonvolatile memory 720). Data access logic 736 represents hardware and software (or firmware) that enables controller 730 to send data for write commands and read data for read commands.

Controller 730 provides data access services for processor 710. Thus, processor 710 is shown connected to controller 730, which in turn is shown connected to memory bus 740. The actual physical architecture may be different than what is shown. Processor 710 executes operations related to flow control in system 700. Many of those operations require access to data stored in memory and storage in traditional systems. In system 700, both may be satisfied by storage 720.

Thus, programs executed by processor 710 may have certain assumptions about data stored in memory versus storage. Processor 710 may include mechanisms for traditional memory access 712 and traditional storage access 714. In a traditional system, it would be expected that nonvolatile storage access takes a relatively long time compared to memory access. Additionally, mechanisms such as direct memory access (DMA) are implemented to reduce wait times associated with storage. However, with nonvolatile memory 720 and the access control provided by controller 730, the assumptions of traditional memory and storage access do not necessarily hold true in system 700. In one embodiment, access to nonvolatile memory 720 serves as memory access as well as storage access; thus, access to either storage or memory is expected to take the same amount of time. Mechanisms such as DMA are not necessary because the storage access does not have the same latency as traditional storage access.

Figure 8:
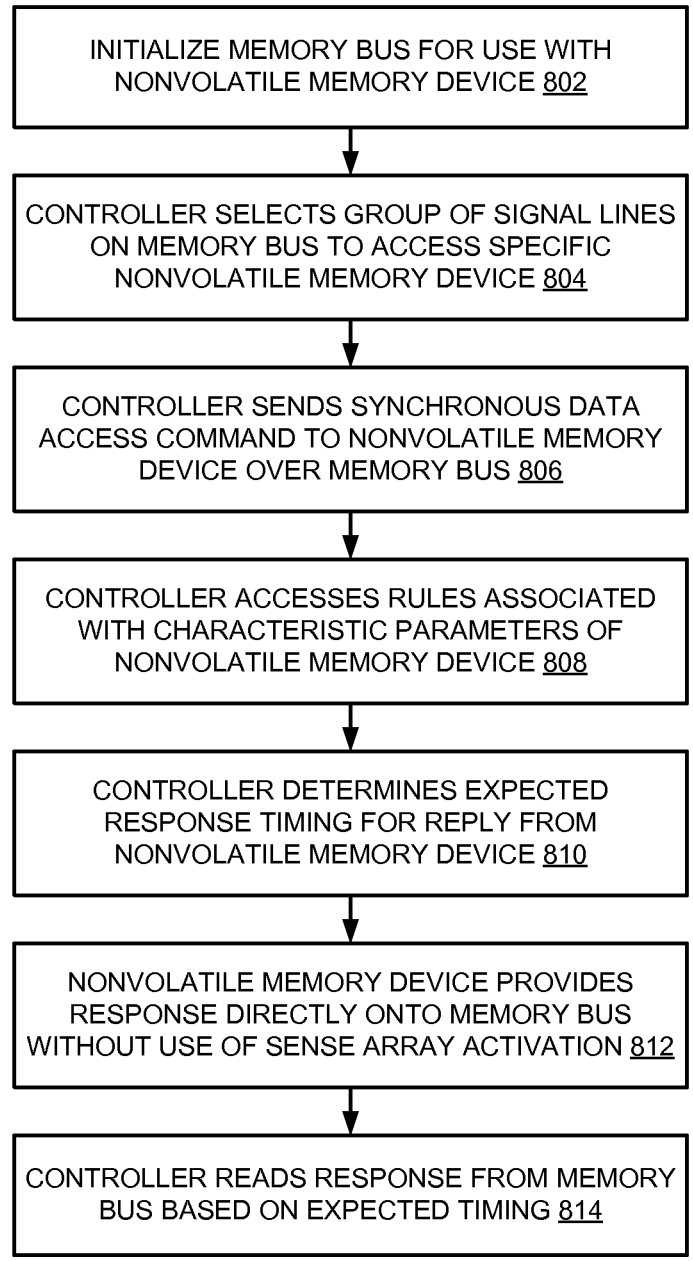
FIG. 8 is a flow diagram of an embodiment of a process for accessing a nonvolatile memory device over a memory bus.

FIG. 8 is a flow diagram of an embodiment of a process for accessing a nonvolatile memory device over a memory bus. Flow diagrams as illustrated herein provide examples of sequences of various process actions. Although shown in a particular sequence or order, unless otherwise specified, the order of the actions can be modified. Thus, the illustrated implementations should be understood only as an example, and the process can be performed in a different order, and some actions may be performed in parallel. Additionally, one or more actions can be omitted in various embodiments of the invention; thus, not all actions are required in every implementation. Other process flows are possible.

A memory bus connects a controller to a nonvolatile memory device over the bus. The bus has a memory architecture, with an electrical interface that implements latency and bandwidth corresponding to volatile memory, but with a "fast" nonvolatile memory device connected to the bus.

The controller initializes the memory bus for use with the nonvolatile memory device, 802. The initialization may include setting registers and/or sending out signals to supporting electrical elements. In particular, the controller uses a different protocol than would otherwise be used on the memory bus to access traditional memory devices.

In one embodiment, all storage access occurs on the same signal lines. In another embodiment, certain nonvolatile memory devices are accessed with certain signal lines, while others are accessed over other signal lines. Use of certain lines on the bus may overlap (e.g., power and clock lines), while others may be separate (e.g., data transfer lines). If nonvolatile memory devices are separated by different signal lines on the memory bus, the controller selects the group of signal lines associated with a specific nonvolatile memory device it is to access, 804. If all storage is accessible via the same signal lines, the lines to use may be assumed in the programming or control logic rather than selected.

The controller sends synchronous data access commands to a selected nonvolatile memory device over the memory bus, 806. The controller accesses rules associated with characteristic parameters of the nonvolatile memory device, 808, and determines an expected response time for the nonvolatile memory device to respond to the command, 810. The rules may be integrated into the logic of the controller, or may be stored in a register or other location for access. The accessing of the rules may indicate the timing, or it could be computed. In one embodiment, the operation of the controller is controlled by a register (e.g., a system configuration register), and selection of a particular device controls operation in accordance with the characteristic parameters of the nonvolatile memory device, without a need to access other storage or make any computations.

In one embodiment, the nonvolatile memory device provides the response to the command directly onto the memory bus (in the case of a read it provides the data onto the memory bus, and may not need to provide anything in response to a write) without the use of a sense array activation, 812. The controller can then read the response from the memory bus based on the expected timing, 814. The controller knows what to read from the memory bus because of the synchronous and deterministic aspects of the nonvolatile memory device access.

Figure 9:
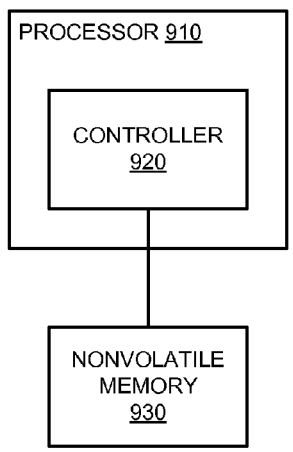
FIG. 9 is a block diagram of an embodiment of a system-on-a-chip with a processor with controller that accesses nonvolatile memory over a memory bus.

FIG. 9 is a block diagram of an embodiment of a system-on-a-chip with a processor with controller that accesses nonvolatile memory over a memory bus. Reference to a system-on-a-chip (SoC or SOC) will be understood to refer to a system that integrates multiple components onto a single I/C. SoC implementations may incorporate components onto the same and/or within the same package as the processor or processing resources. In SoC 900, controller 920 is integrated onto the same die as processor 910. Other components may also be integrated onto the same I/C as processor 910. In one embodiment, only nonvolatile memory 930 is separate from the packaging of processor 910, and all other system components are integrated within the packaging of processor 910.

As described herein, controller 920 interfaces with nonvolatile memory 930 over a bus having a memory architecture. Thus, even though nonvolatile memory 930 is nonvolatile, processor 910 accesses it over a memory bus instead of a storage bus. Controller 920 accesses nonvolatile memory 930 as discussed above, with a protocol that reads and writes data in accordance with the determinism of the operation of nonvolatile memory 930.

Figure 10:
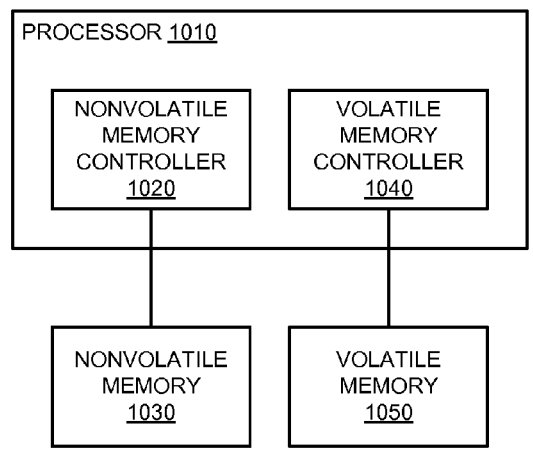
FIG. 10 is a block diagram of an embodiment of a system-on-a-chip with a processor with separate controllers that accesses volatile memory and nonvolatile memory over a memory bus.

FIG. 10 is a block diagram of an embodiment of a system-on-a-chip with a processor with separate controllers that accesses volatile memory and nonvolatile memory over a memory bus. SoC 1000 is very similar to SoC 900 of FIG. 9. SoC 1000 includes nonvolatile memory controller 1020 integrated onto the same die as processor 1010, and accesses nonvolatile memory 1030 over a memory bus architecture. Additionally, volatile memory controller 1040 is integrated onto the same die as processor 1010. Similar to what is described above, volatile memory controller 1040 may be physically or logically separate from nonvolatile memory controller 1020. In one embodiment, only one or the other will be used in an application of SoC 1000.

Other components may also be integrated onto the same I/C as processor 1010. In one embodiment, only nonvolatile memory 1030 and/or volatile memory 1050 are separate from the packaging of processor 1010, and all other system components are integrated within the packaging of processor 1010. As described herein, nonvolatile memory controller 1020 interfaces with nonvolatile memory 1030 over a bus having a memory architecture. Nonvolatile memory controller 1020 accesses nonvolatile memory 1030 as discussed above, with a protocol that reads and writes data in accordance with the determinism of the operation of nonvolatile memory 1030. The operation of volatile memory controller 1040 and volatile memory 1050, if used, are as understood by those skilled in the art.

Figure 11:
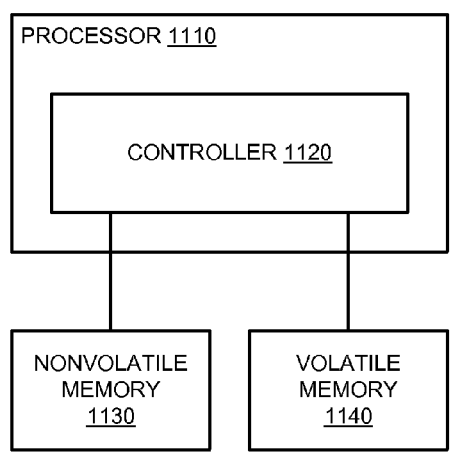
FIG. 11 is a block diagram of an embodiment of a system-on-a-chip with a processor with shared controller that accesses both volatile memory and nonvolatile memory over a memory bus.

FIG. 11 is a block diagram of an embodiment of a system-on-a-chip with a processor with shared controller that accesses both volatile memory and nonvolatile memory over a memory bus. In one embodiment, SoC 1000 of FIG. 10 illustrates physically separate memory controllers, while SoC 1100 illustrates logically separated controllers, or simply shows a controller that includes functionality to operate with either nonvolatile memory 1130 or volatile memory 1140.

SoC 1100 includes controller 1120 integrated onto the same die as processor 1110, allowing access to nonvolatile memory 1130 over a memory bus architecture, and/or allowing access to volatile memory 1140. Other components may also be integrated onto the same I/C as processor 1110. In one embodiment, only nonvolatile memory 1130 and/or volatile memory 1140 are separate from the packaging of processor 1110, and all other system components are integrated within the packaging of processor 1110.

As described herein, controller 1120 interfaces with nonvolatile memory 1130 over a bus having a memory architecture. It may be the same physical bus over which volatile memory 1140 would be accessed. In one embodiment, either nonvolatile memory 1130 or volatile memory 1140 are connected to processor 1110, but not both at the same time. Controller 1120 accesses nonvolatile memory 1130 as discussed above, with a protocol that reads and writes data in accordance with the determinism of the operation of nonvolatile memory 1130. The operation of controller 1120 with respect to volatile memory 1140, if used, is as understood by those skilled in the art.

Figure 12:
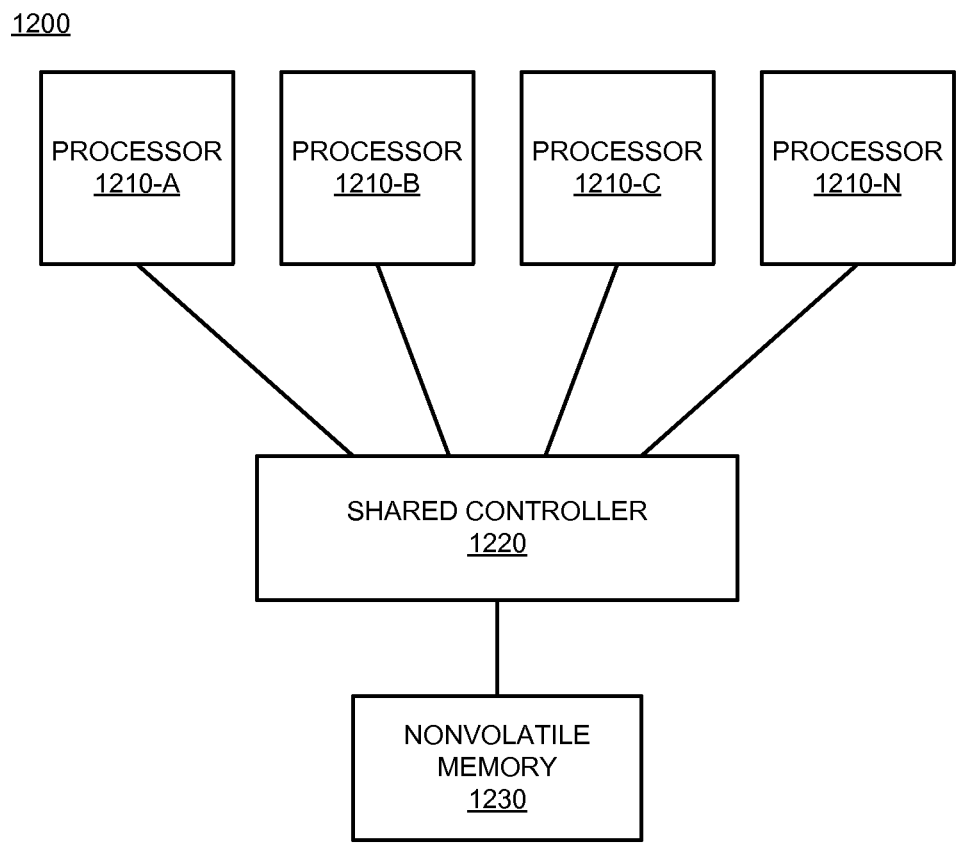
FIG. 12 is a block diagram of an embodiment of a system with multiple processors that access nonvolatile memory over a memory bus via a shared controller.

FIG. 12 is a block diagram of an embodiment of a system with multiple processors that access nonvolatile memory over a memory bus via a shared controller. In one embodiment, system 1200 is not an SoC, but it may be considered an SoC in the case of a multi-core system with other components integrated onto the same die. For example, shared controller 1220 may be integrated onto a multi-core processor. In one embodiment, system 1200 illustrates a multi-socket system (with four sockets as illustrated), with a shared controller and a shared storage/memory resource.

Processors 1210-A through 1210-D share controller 1220. More generally, system 1200 represents an architecture where processors A through N share a controller. The processors access nonvolatile memory 1230 via shared controller 1220 over a memory bus architecture, rather than over a storage bus. As discussed above, the operation of nonvolatile memory 1230 is deterministic to enable the processors to determine what access data corresponds with what access command. System 1200 may be, for example, a server scenario where a machine with multiple processors uses shared resources.

Various operations or functions are described herein, which may be described or defined as software code, instructions, configuration, and/or data. The content may be directly executable ("object" or "executable" form), source code, or difference code ("delta" or "patch" code). The software content of the embodiments described herein may be provided via an article of manufacture with the content stored thereon, or via a method of operating a communications interface to send data via the communications interface. A machine readable medium or computer readable medium may cause a machine to perform the functions or operations described, and includes any mechanism that provides (i.e., stores and/or transmits) information in a form accessible by a machine (e.g., computing device, electronic system, or other device), such as via recordable/non-recordable storage media (e.g., read only memory (ROM), random access memory (RAM), magnetic disk storage media, optical storage media, flash memory devices, or other storage media) or via transmission media (e.g., optical, digital, electrical, acoustic signals or other propagated signal). A communication interface includes any mechanism that interfaces to any of a hardwired, wireless, optical, or other medium to communicate to another device, such as a memory bus interface, a processor bus interface, an Internet connection, a disk controller. The communication interface can be configured by providing configuration parameters and/or sending signals to prepare the communication interface to provide a data signal describing the software content.

Various components described herein may be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A bus controller device comprising:
an electrical hardware bus interface to connect to a device bus, the device bus to connect to a nonvolatile memory device; and
device bus processing logic to read data from and write commands to the nonvolatile memory device over the device bus, wherein the processing logic is to
send a data access command over the device bus to the nonvolatile memory device connected to the device bus;
determine an expected timing of a response to the data access command from the nonvolatile memory device based on when the command was sent and characteristic parameters of the nonvolatile memory device; and
read the response from the nonvolatile memory device from the device bus based on the determined expected timing.

2. The bus controller of claim 1, wherein the nonvolatile memory device comprises a phase change memory (PCM).

3. The bus controller of claim 1, wherein the nonvolatile memory device cells comprise switches.

4. The bus controller of claim 1, wherein the processing logic is to send the data access command over multiple clock cycles.

5. The bus controller of claim 1, wherein the processing logic is to determine the expected timing based on rules indicating the characteristic parameters of the nonvolatile memory device.

6. The bus controller of claim 1, wherein the nonvolatile memory device comprises a first nonvolatile memory device and the data access command comprises a first data access command, and further comprising the processing logic to send the first data access command to the first nonvolatile memory device over a first set of signal lines, and to send a second data access command to a second nonvolatile memory device over a second set of signal lines different from the first set of signal lines.

7. The bus controller of claim 1, wherein the processing logic is to send the data access command without sending an activation command, and is to read the response from the nonvolatile memory device without reading a sense amplifier.

8. A method comprising:
sending a data access command from a bus controller to a nonvolatile memory device over a device bus;
determining an expected timing of a response to the data access command from the nonvolatile memory device based on when the command was sent and characteristic parameters of the memory device; and
reading the response from the memory device from the device bus based on the determined expected timing.

9. The memory of claim 8, wherein the nonvolatile memory device comprises a phase change memory (PCM) device.

10. The memory of claim 9, wherein the nonvolatile memory device cells comprise switches.

11. The memory of claim 8, wherein sending the data access command comprises sending the data access command over multiple clock cycles.

12. The memory of claim 8, wherein determining the expected timing comprises determining the expected timing by reading a register.

13. The memory of claim 8, wherein the nonvolatile memory device comprises a first nonvolatile memory device, and further comprising sending an additional data access command to a second nonvolatile memory device over a second set of signal lines different from a first set of signal lines used to send the data access command to the first nonvolatile memory device.

14. A system comprising:
an electrical hardware bus interface to connect to a device bus, the device bus to connect to a nonvolatile memory device;
device bus processing logic to read data from and write commands to the nonvolatile memory over the device bus, wherein the processing logic is to
send a data access command over the device bus to the nonvolatile memory device connected to the device bus;
determine an expected timing of a response to the data access command from the nonvolatile memory device based on when the command was sent and characteristic parameters of the nonvolatile memory device; and
read the response from the nonvolatile memory device from the device bus based on the determined expected timing; and
a multi-core processor coupled to the device bus processing logic to generate access requests for data stored on the nonvolatile memory device.

15. The system of claim 14, wherein the nonvolatile memory devices comprise phase change memory devices.

16. The system of claim 14, wherein the nonvolatile memory device cells comprises switches.

17. The system of claim 14, wherein the processing logic is to send the data access command over multiple clock cycles.

18. The system of claim 14, wherein the processing logic is to determine the expected timing by reading a system configuration register.

* * * * *